United States Patent
Li et al.

(10) Patent No.: US 9,613,779 B2
(45) Date of Patent: Apr. 4, 2017

(54) SCANNING TRANSMISSION ELECTRON MICROSCOPE WITH VARIABLE AXIS OBJECTIVE LENS AND DETECTIVE SYSTEM

(71) Applicants: Shuai Li, Beijing (CN); Wei He, Beijing (CN); Zhongwei Chen, San Jose, CA (US)

(72) Inventors: Shuai Li, Beijing (CN); Wei He, Beijing (CN); Zhongwei Chen, San Jose, CA (US)

(73) Assignee: NINGBO FOCUS-EBEAM INSTRUMENTS INC., Ningbo (CN)

( * ) Notice: Subject to any disclaimer, the term of this patent is extended or adjusted under 35 U.S.C. 154(b) by 0 days.

(21) Appl. No.: 14/940,102

(22) Filed: Nov. 12, 2015

(65) Prior Publication Data

US 2016/0351371 A1    Dec. 1, 2016

(51) Int. Cl.
*H01J 37/21* (2006.01)
*H01J 37/145* (2006.01)
*H01J 37/147* (2006.01)
*H01J 37/28* (2006.01)

(52) U.S. Cl.
CPC ........ *H01J 37/145* (2013.01); *H01J 37/1477* (2013.01); *H01J 37/21* (2013.01); *H01J 37/28* (2013.01); *H01J 2237/0473* (2013.01); *H01J 2237/2802* (2013.01)

(58) Field of Classification Search
CPC ...... H01J 37/244; H01J 37/28; H01J 37/3174; H01J 2237/1035; H01J 2237/04926
See application file for complete search history.

(56) References Cited

U.S. PATENT DOCUMENTS

| | | | |
|---|---|---|---|
| 4,544,846 A | 10/1985 | Langner et al. | |
| 6,060,711 A | * 5/2000 | Shimizu | B82Y 10/00 250/396 ML |
| 6,392,231 B1 | 5/2002 | Chen | |
| 6,531,697 B1 | 3/2003 | Nakamura et al. | |
| 6,548,810 B2 | 4/2003 | Zaluzec | |
| 7,285,776 B2 | 10/2007 | Nakamura et al. | |
| 7,355,177 B2 | 4/2008 | Kamiya et al. | |
| 7,459,683 B2 | 12/2008 | Araki et al. | |
| 7,745,787 B2 | 6/2010 | Kamiya et al. | |

(Continued)

OTHER PUBLICATIONS

Yan Zhao et al., "Comparative study on magnetic variable axis lenses using electrostatic and magnetic in-lens deflectors", Proceedings of the SPIE, vol. 3777, 1999, p. 107-1.

(Continued)

*Primary Examiner* — Nicole Ippolito
*Assistant Examiner* — Sean Luck
(74) *Attorney, Agent, or Firm* — Guosheng Wang; United States Research and Patent Firm

(57) ABSTRACT

The present invention provides a scanning transmission electron microscope (STEM). In the STEM, a specimen is sandwiched between a variable axis objective lens and a variable axis collection lens. The axis of the collection lens varies along with the variation of the objective lens axis in a coordinated manner. The STEM of the invention exhibits technical merits such as large scanning field, high image resolution across the entire scanning field, and high throughput, among others.

17 Claims, 12 Drawing Sheets

(56) References Cited

U.S. PATENT DOCUMENTS

| | | | |
|---|---|---|---|
| 2004/0046125 A1* | 3/2004 | Chen | H01J 37/141 250/396 ML |
| 2007/0181829 A1* | 8/2007 | Tanaka | B82Y 10/00 250/492.2 |
| 2012/0012747 A1 | 1/2012 | Lazar et al. | |

OTHER PUBLICATIONS

Yan Zhao et al., "Variable axis lens of mixed electrostatic and magnetic fields and its application in electron-beam lithography systems" Journal of Vacuum Science & Technolog.

* cited by examiner

SCANNING TRANSMISSION ELECTRON MICROSCOPE WITH VARIABLE AXIS OBJECTIVE LENS AND DETECTIVE SYSTEM

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

FIELD OF THE INVENTION

The present invention generally relates to the technical field of charged particle microscope, and more particularly, to a scanning transmission electron microscope (STEM) for examining biological and cryogenic specimens. The STEM has a variable axis objective lens and a variable axis collection lens, between which is the specimen to be inspected. The axis of the collection lens varies along with the variation of the objective lens axis in a coordinated manner. The STEM of the invention exhibits technical merits such as large scanning field, high image resolution across the entire scanning field, and high throughput, among others.

The present invention can also find applications in various microscopes using other charged particles, for example, proton, positively or negatively charged atoms, positive ions such as Gallium ions and Helium ions, and positively or negatively charged molecules.

BACKGROUND OF THE INVENTION

In a charged-particle microscope (CPM), an imaging beam of charged particles is directed onto a sample from an illuminator. In a transmission-type CPM (TCPM), a detector is used to intercept a flux of charged particles that traverse the sample, generally with the aid of an imaging system that is used to focus (part of) said flux onto the detector. Such a TCPM can be used in scanning mode (STCPM), in which case the beam of charged particles from the illuminator is scanned across the sample, and the detector output is recorded as a function of scan position. In addition to imaging, a CPM may also have other functionalities, such as performing spectroscopy, examining diffractograms, performing (localized) surface modification (e.g. milling, etching, and deposition), etc. An illuminator refers to a particle-optical column comprising one or more electrostatic and/or magnetic lenses that can be used to manipulate a "raw" charged-particle beam from a source (e.g. a Schottky source or ion gun), serving to provide it with a certain focus or deflection and/or to mitigate one or more aberrations therein. An illuminator can be provided with a deflector system that can be invoked to cause the beam to perform a scanning motion across the sample under investigation.

Electrons, because of their wave-particle duality, can be accelerated to have picometer wavelength and focused to image in real space. It is now possible to image with high resolution, reaching the sub-Angstrom scale. Well-known electron microscopes include Transmission Electron Microscope (TEM), Scanning Electron Microscope (SEM), Scanning Transmission Electron Microscope (STEM), and "dual-beam" tools (e.g. a FIB-SEM), which additionally employ a "machining" Focused Ion Beam (FIB), allowing supportive activities such as ion-beam milling or Ion-Beam-Induced Deposition (IBID). In a TEM, the electron beam used to irradiate a sample will generally be of significantly higher energy than in the case of a SEM (e.g. 300 keV vs. 10 keV), so as to allow its constituent electrons to penetrate the full depth of the sample. A sample investigated in a TEM will also generally need to be thinner than that investigated in a SEM. In traditional electron microscopes, the imaging beam is "on" for an extended period of time during a given imaging capture; however, electron microscopes are also available in which imaging occurs on the basis of a relatively short "flash" or "burst" of electrons, which approach is particularly useful when a user is attempting to image moving samples or radiation-sensitive specimens.

Scanning transmission electron microscope (STEM) is operated under a principle similar to scanning electron microscope (SEM). A primary beam is emitted from an electron source and focused by objective lens on a specimen which is about 100 nm in thickness. Deflectors drive the focused primary beam to scan on the specimen, and the electrons that have penetrated through the specimen are collected by a detector to generate an image. FIG. 1 schematically illustrates the configuration of a conventional scanning transmission electron microscope in the prior art.

With reference to FIG. 1, the scanning transmission electron microscope 100 comprises an electron source 101 for generating a primary electron beam 102a onto a specimen 106 along center optical axis 103. In a high resolution STEM, the electron source is generally a thermal field emission electron source or a cold field emission electron source. The STEM 100 also includes an objective lens 105 for forming the magnetic field to focus the primary electron beam 102a onto the filmy specimen 106. Condenser lens, image aperture and other optical components which are located between the electron source and the objective lens are not shown in FIG. 1. A deflection system 104 for deflecting the primary electron beam 102a over the specimen 106 to form a scanning pattern. The deflection system consists of two magnetic or electrostatic deflectors 104a and 104b which are away from objective lens field. The specimen 106 is put on a stage for adjusting the specimen height to the focused plane of primary electron beam and moving observed area of specimen. The specimen 106 is between the upper pole 105a piece and lower pole piece 105b of objective lens to make an immersion objective lens system. Immersion objective lens ensures a small focused spot on axis because the spherical aberration coefficient and chromatic aberration coefficient are smaller than the objective lens field far away from the specimen. The focused field above specimen 106 can be shown as a convex upper lens field 107; and the focused field below the specimen 106 can be shown as a convex lower lens field 108.

Primary beam landing on filmy specimen is focused by objective lens 105. Then transmission electron beam 109a is formed and received by a transmission electron detector 110. The transmission detector includes a bright-field detective area 110b in center to only catch transmit electron through specimen 106 and a circular dark-field detective area 110a outside to catch the scatter in and transmit electron through specimen 105. Sometimes bright-field detective area 110a and dark-field detective area 110b are located on different height to enhance receiving efficiency. As shown in FIG. 1, in scanning center, deflection system does not work on the primary beam. The transmission electron beam is perfectly caught by bright-field area and dark-field area following distribution of transmission angle.

FIG. 2 shows a modified STEM 100a based on conventional STEM 100 as shown in FIG. 1. When the primary beam 102b is deflected to off-axis position in scanning field expect the scanning center, deflector 104a deflects the primary beam first, and then deflector 104b deflects the beam back to a region close to the optical axis of objective lens. The rational is not to make a large off-axis aberration in scanning field edge, but the scanning field is limited because primary beam 102b cannot be deflected into a region far away from the center optical axis 103. Moreover, the transmission electron beam 109b cannot be received by detector as the center transmission electron beam 109a. Bright-field detective 110a area cannot catch the pure direct transmission electrons, and dark-field detective area 110b cannot perfectly catch the scatter transmission electrons from large radical emission angle. As such, image quality at the scanning field edge is not as good as that in the center.

FIG. 3 shows a modified STEM 100b based on STEM 100a as shown in FIG. 2. An additional de-scan deflective system 111 is installed below the specimen and away from objective lens to correct the transmission electron beam from scanning field back to the center optical axis. This de-scan deflective system has one or two magnetic or electrostatic deflectors, 111a and 111b. De-scan deflective system 111 deflects transmission electron beam 109c from off-axis position back to center optical axis. So the transmission electron beam from different scanning position will have the same or similar radial emission angle to be projected on the detector. De-scan deflective system 111 eliminates the position effect on transmission electrons reception. But the scanning field of primary beam remains limited by the deflective system 104 and objective lens 105, especially on high resolution image condition. If the deflective system deflects primary beam at a large scanning field edge, off-axis aberrations will increase drastically because primary beam dose not enter into the region near axis of focused field 107 above specimen. On the other hand, de-scan deflective system cannot correct transmission electron from the position with large radial distance position. At the position with large radial distance from center optical axis, transmission electrons through specimen enter into the region far away from the axis of focused field 108 below specimen. The transmission electron beam is converged strongly by focused field 108 with large off-axis aberrations and the projection trajectory is very different from the center transmission electron. The de-scan deflective system cannot correct the trajectory of transmission electrons from large scanning field edge and center transmission electrons back to center optical axis simultaneously.

In the prior art, the scanning field is limited below several micro meters (um) at high resolution image mode. For example, conventional STEM usually has 0.5 um×0.5 um maximum scanning field with 0.5 nm resolution, or 2 um×2 um maximum scanning field with 2 nm resolution.

In high resolution STEM, primary electron beam is intensely focused on specimen. The focus spot size is usually in the magnitude of several nanometers, or even several angstroms. Usually, a specimen is placed in the focus field of the objective lens (in-lens type). This design of lens shows relatively small aberration coefficients. U.S. Pat. Nos. 7,285,776, 7,355,177, 7,459,683 and 7,745,787 disclose an in-lens type objective lens for STEM. Thin specimen is placed between upper pole piece and lower piece of objective lens, and the specimen is immersed in the magnetic field of the objective lens. The in-lens type structure ensures a small spot size on specimen, in other words, it ensures a high resolution image.

The size of the scanning field has a great impact on the throughput of STEM. At the same scanning speed and beam current, the larger the scanning field, the higher the throughput. Compared to STEM with large scanning field, STEM with small scanning field demands more time in manipulating the specimen stage (e.g. moving and stopping) in order to change the area of interest (or observed portion) in the specimen under inspection. Mechanical manipulation of specimen stage takes much longer time than electron beam scanning.

In traditional in-lens objective lens structure, specimen is immersed in focus field to ensure high resolution, but the scanning field is very small. Since the focus magnetic lens is very close to specimen, at the short focal length, the off-axis aberrations such as coma, chromatic aberrations and distortion increase quickly, and in proportional to the distance from center optical axis. To achieve approximate resolution between center and scanning field edge, the primary beam must be deflected only near the optical axis, and thus cover a small scanning field. Traditional in-lens type STEMs usually have several micrometers or several hundred nanometers scanning field at high resolution (several nanometers or several angstroms spot size).

U.S. Pat. No. 4,544,846 teaches a variable axis immersion electron lens (VAIL) projection system. A deflector having a designed field coupled to focus field can shift the optical axis of objective lens. When the axis is shifted to the same position and direction as the scanning beam, the off-axis aberrations are eliminated, and a small spot size is obtained similar to that with the center optical axis.

U.S. Pat. No. 6,392,231 discloses another VAIL system, called swing axis immersion electron lens (SAIL). The SAIL is used to achieve a large scanning field in SEM. A deflector having a designed field coupled to focus field can swing the optical axis of objective lens. When the axis is swing to the same position and direction as the scanning beam, the off-axis aberrations are eliminated and a similar spot size is obtained as center optical axis can.

Yan Zhao et al. have attempted to use the variable axis objective lens concept in SEM and electron beam lithography. They have also proposed on how to make different types of variable axis system by using different types of coupling conditions between deflectors and objective lens. For details, see Yan Zhao et al. "Comparative study on magnetic variable axis lenses using electrostatic and magnetic in-lens deflectors", Proceedings of the SPIE, Volume 3777, 1999, p. 107-114; as well as Yan Zhao et al. "Variable axis lens of mixed electrostatic and magnetic fields and its application in electron-beam lithography systems" Journal of Vacuum Science & Technology, B 17(6), Nov/Dec 1999, p. 2795-2798.

When the primary beam is focused on a specimen in an immersion field, electrons that transmit the thin film specimen is focused and projected on a detector. The transmission electrons carry the information about the structure and materials contrast of specimen. The detector is usually divided into bright-field detective portion and dark-field detective portion to catch the transmission electron with different angular ranges. The bright-field detector collects the direct transmission electrons and the dark-field detector mainly collects the scatter transmission electrons taking atomic number signal in large angular range. In STEM, the transmission electrons from the scanning field edge have a different position on detector compared to center transmission electrons on optical axis. Thus the transmission electrons from scanning field except the center cannot be projected on detector circle symmetrically as the center transmission electrons. The bright-field and dark-field detectors cannot catch the signal transmission electrons precisely corresponding to transmission angle, so the image quality and contrast at the edge of the scanning field is worse than scanning center. It is impossible to obtain a high resolution image in large scanning field. To resolve the problem, international application publication WO2012/009543 discloses a de-scan deflective system that is put below the specimen in a STEM to correct the projection trajectory of transmission electrons. This de-scan deflective system eliminate the difference of projective location of transmission electrons on detector. But compared with the deflectors which are coupled with focus field in variable axis lens system, the deflector in WO2012/009543 can only correct the transmission electrons from relative small scanning field.

Thus, there is a need to enlarge the scanning field of STEM, and in the meanwhile, to maintain a high resolution image. For example, a trend in recent years is using an electron microscope to generate high resolution image for 3D reconstruction of tissue volume in biological research. However, the throughput of convectional scanning transmission electron microscope is not satisfactory, because of the small scanning field and low scanning speed. Advantageously, the STEM of the invention can acquire high resolution images in large area and at a high speed.

SUMMARY OF THE INVENTION

One aspect of the present invention provides a scanning transmission electron microscope (STEM) comprising the following components: (1) an electron source for emitting a primary electron beam; (2) a detector for receiving the electron beam, wherein a reference axis is defined by the straight line connecting the electron source and the detector; (3) a specimen plane located between the electron source and the detector, wherein the reference axis is perpendicular to the specimen plane; (4) a first redirector that redirects the electron beam to a path not in alignment with the reference axis; (5) a lens module comprising a variable axis objective lens and a variable axis collection lens, between which is the specimen plane. The variable axis objective lens is located between the electron source and the specimen plane for focusing the electron beam redirected by said first redirector to a focusing spot on the specimen plane. The variable axis collection lens is located between the specimen plane and the detector for collecting the electron beam that has passed through the specimen plane; and (6) a second redirector that redirects the electron beam that has been collected by the variable axis collection lens back to a path in alignment with the reference axis, before the beam reaches the detector.

Another aspect of the present invention provides an electron microscope. The microscope includes an electron source for emitting a primary electron beam; a detector for receiving and detecting the electron beam; a specimen plane located between the electron source and the detector, wherein at least a portion of the electron beam can pass through the specimen plane; and a variable axis collection lens located between the specimen plane and the detector for collecting the electrons that have passed through the specimen plane.

One of the advantages associated with the STEM of the present invention is that its scanning field is increased, but not at the cost of sacrificing the image resolution. In other words, the invention can meet two requirements at the same time, large scanning field and high image resolution. Typical embodiments of the invention employ a variable axis objective lens for primary scanning beam and a variable axis collection lens system for correcting transmission signal beam.

The above features and advantages and other features and advantages of the present invention are readily apparent from the following detailed description of the best modes for carrying out the application when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity, elements shown in the figures and discussed below have not necessarily been drawn to scale. Well-known structures and devices are shown in simplified form such as block diagrams in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a schematic cross-sectional view of the scanning transmission electron microscope (STEM) according to an embodiment of the present invention will be described with reference to FIG. 4(a).

Figure 1:
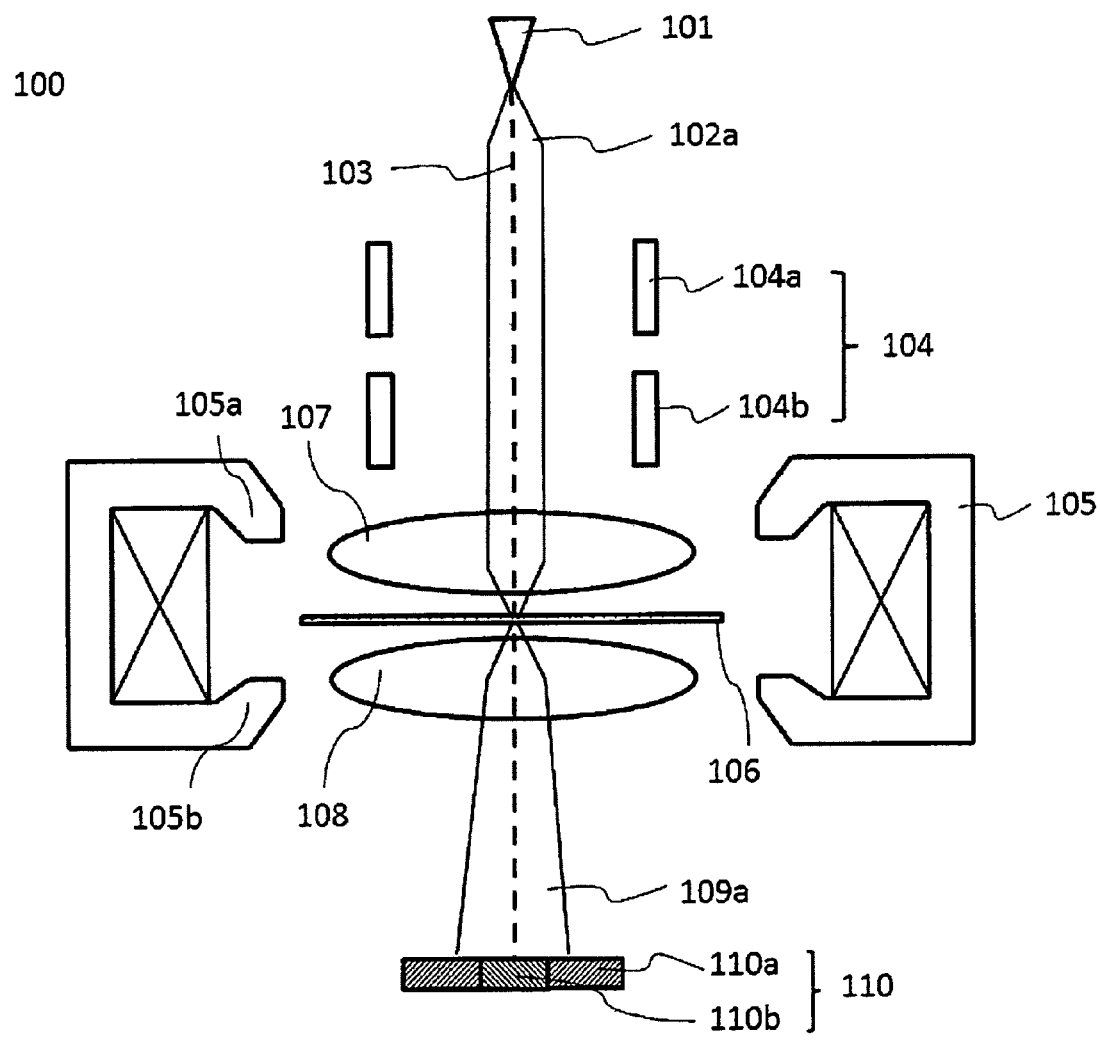
FIG. 1 is a diagrammed representation of a conventional scanning transmission electron microscope (STEM) in the prior art.
Figure 2:
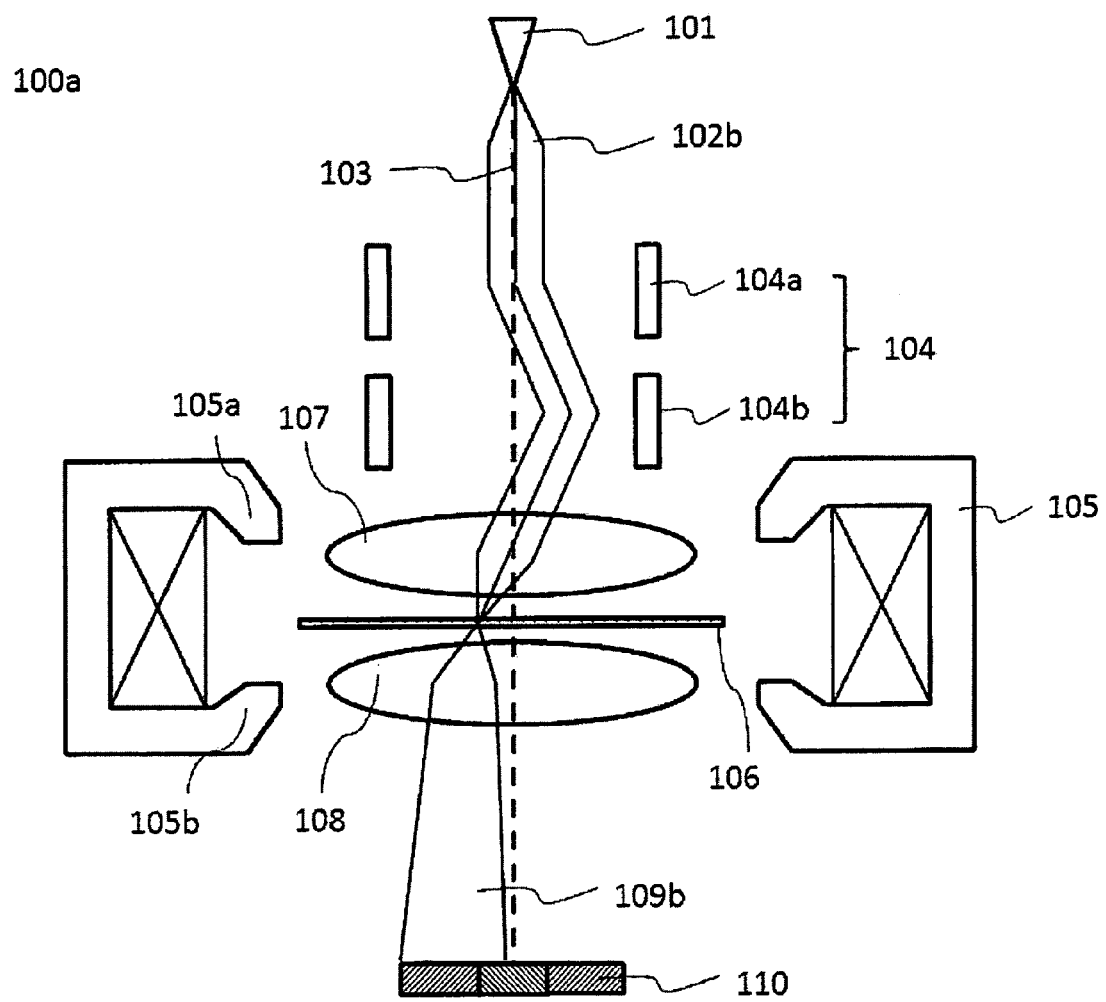
FIG. 2 shows a modified STEM in the prior art based on the STEM as shown in FIG. 1.
Figure 3:
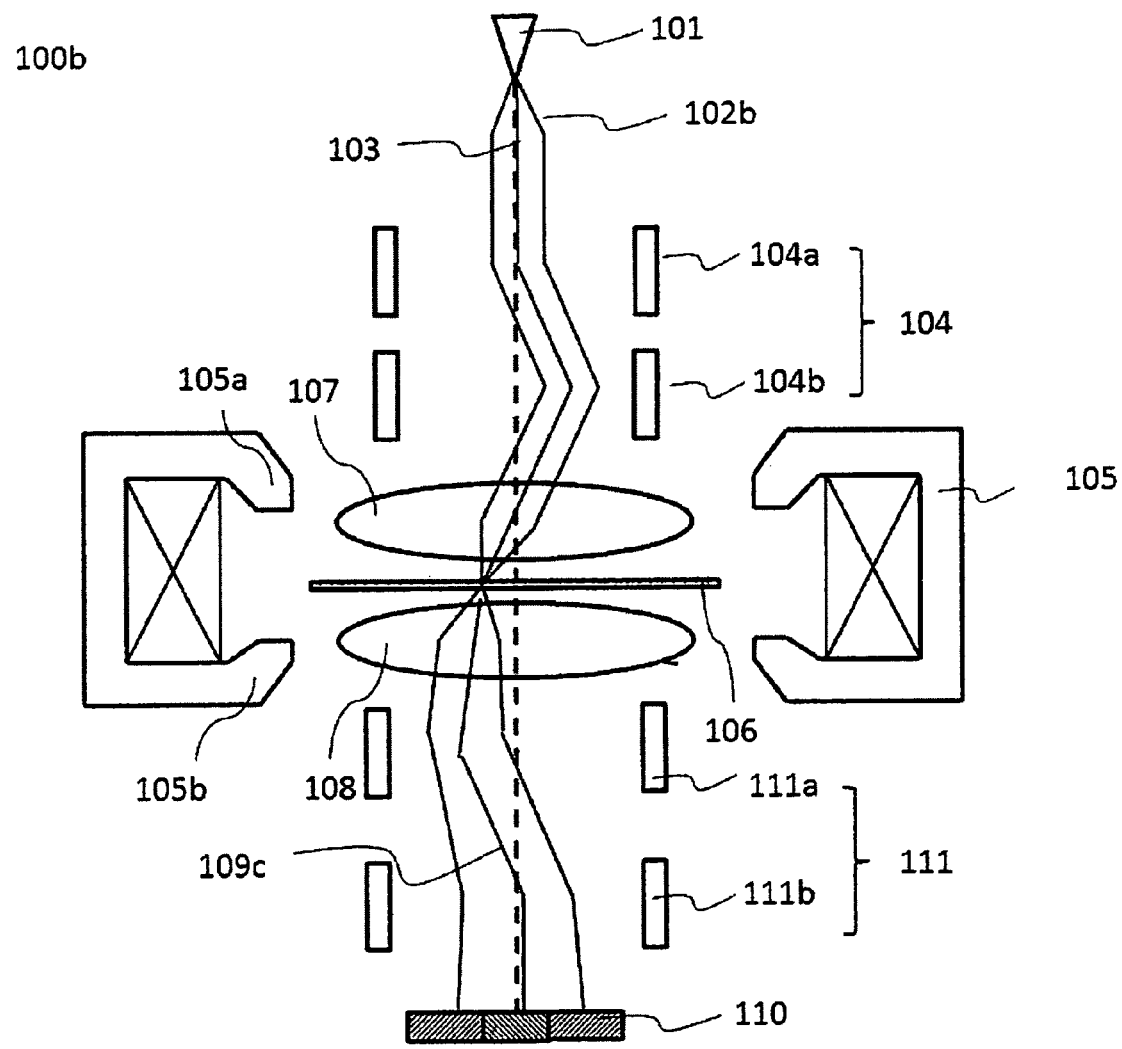
FIG. 3 shows a further modified STEM in the prior art based on the STEM as shown in FIG. 2.
Figure 4A:
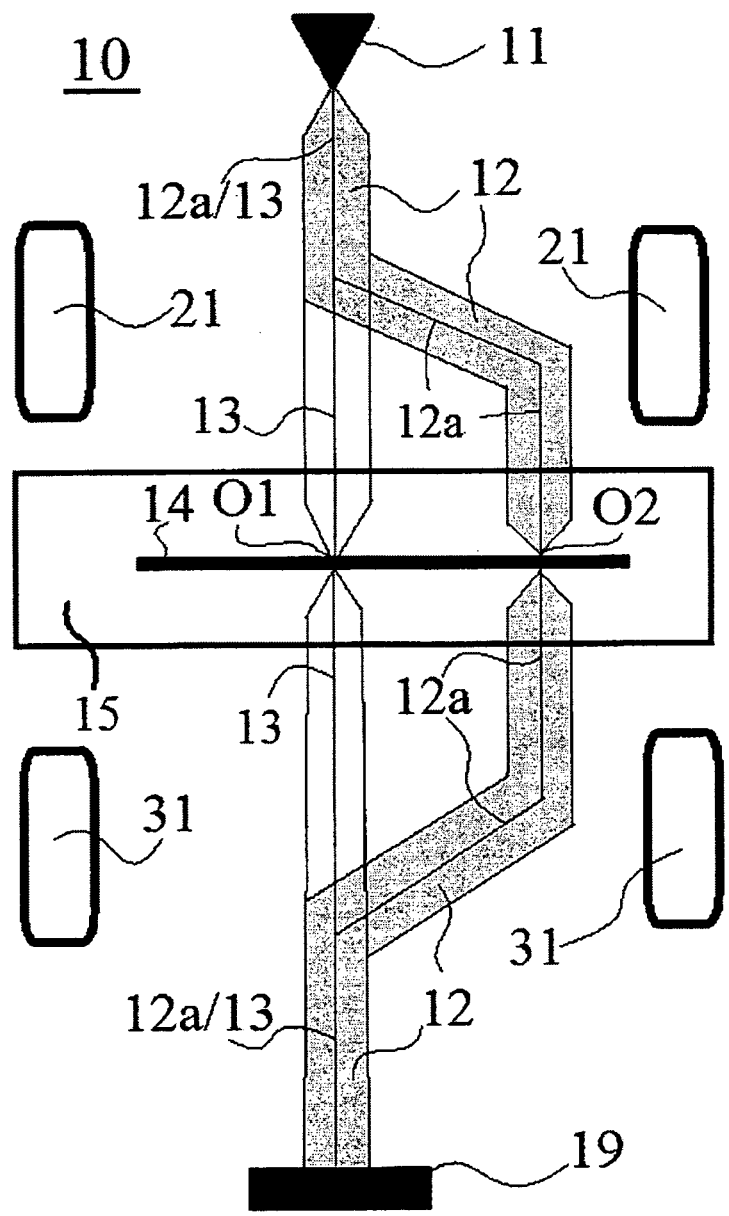
FIG. 4(a) shows a schematic cross-sectional view of a scanning transmission electron microscope (STEM) according to an embodiment of the present invention.

With reference to FIG. 4(a), STEM 10 comprises an electron source 11, such as a Schottky gun, for emitting a primary electron beam (or flux) 12, and a detector 19 for receiving and detecting electron beam 12. In this invention, "primary electrons" means "electrons emitted from an electron source and incident onto a being-observed specimen, and "transmission electrons" means "electrons through the specimen formed by the primary electrons". Electron source 11 may be a thermal field emission electron source or a cold field emission electron source. A conceptual reference axis 13 can therefore be defined as the straight line connecting electron source 11 (e.g. the center thereof) and detector 19 (e.g. the center thereof). Reference axis 13 is also known as center optical axis of STEM. Electron source 11 is typically excited to emit primary electrons along an optical axis of the electron beam apparatus, which coincides reference axis 13. An accelerating electrode (not shown) may be located below electron source 11 and configured to have an opening aligned with the optical axis for primary electrons passing through. The accelerating electrode may be excited to accelerate primary electrons to have desired first energies. A condenser lens (not shown) is below the accelerating electrode and aligned with the optical axis. A beam-limiting aperture plate (not shown) below the condenser lens has a plurality of apertures with different radial sizes. An aperture can control a spread angle of the primary electron beam. The condenser lens may be excited to make a part of the primary electrons pass through the beam-limit aperture so as to form a primary electron beam with a desired current value.

A thin sheet specimen to be examined is located between electron source 11 and detector 19, and is represented as the specimen plane 14. The physical arrangement of electron source 11, detector 19 and specimen place 14 is such that reference axis 13 is perpendicular to the specimen plane 14. Reference axis 13 passes through a reference point O1 on the specimen plane 14.

In FIG. 4(a), a conceptual axis of beam 12 can be represented as beam axis 12a. The expression "electron beam 12 travels in a path in alignment with reference axis 13" is intended to mean that beam axis 12a is substantially coaxial with reference axis 13, or beam axis 12a substantially coincides with reference axis 13.

Upon emitted out from the electron source 11, and in the absence of any influence from a redirector, electron beam 12 always travels, or propagates, in a path in alignment with reference axis 13, and axis 12a and axis 13 are always merged or overlapped, as shown in FIG. 4. Once a first redirector 21 starts to function, it redirects electron beam 12 to a path that is not in alignment with reference axis 13 anymore. In other words, beam axis 12a diverges, or is deviated, from reference axis 13, and starts to travel along a different direction. As will be explained in detail, first redirector 21 is useful for redirecting or deflecting electron beam 12 above specimen plane 14 to form a scanning pattern. First redirector 21 may include one or more magnetic deflectors, electrostatic deflectors, or any combination thereof.

Figure 4B:
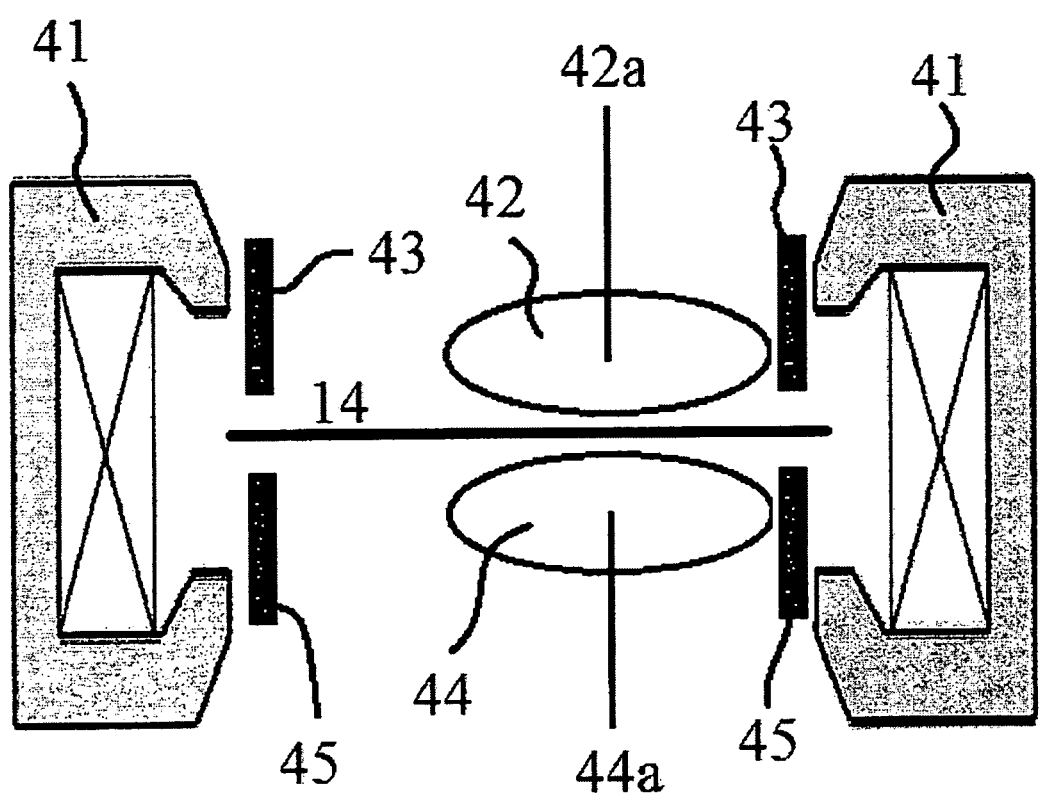
FIG. 4(b) illustrates the lens module of FIG. 4(a) in more details according to an embodiment of the present invention.

Referring to FIG. 4(a), a lens module 15 generates a magnetic lens field, and specimen plane 14 is preferably located on or near the plane with maximum field intensity in the magnetic lens field. FIG. 4(b) illustrates the configuration of lens module 15 in more details. Lens module 15 in FIG. 4(b) comprises magnetic lens field generator 41, objective lens 42 having a variable central axis 42a, and collection lens 44 having variable central axis 44a. While central axis 42a is varied by a first in-lens deflector 43, central axis 44a is varied by a second in-lens deflector 45. First in-lens deflector 43 may have a coupling field with the objective lens 42 field for varying, for example, laterally or parallel moving (like "sliding" on specimen plane 14) the central axis 42a; or swinging the central axis 42a of objective lens 42 about a pivot above the specimen plane 14. In "swinging the central axis 42a", the lens 42 is like a bob (pendulum), and the central axis 42a is like the cord connecting the bob and the pivot. Lens module 15 may further include a second in-lens deflector 45 for varying the central axis 44a of the collection lens 44 field, in a manner similar to varying 42a. The second in-lens deflector 45 may also have a coupling field with the collection lens 44 field for varying (e.g. parallel moving or swinging) the central axis 44a, in a manner similar to varying 42a.

Variable axis objective lens 42 is located between the electron source 11 and the specimen plane 14 for focusing the electron beam 12 redirected by said first redirector 21 to a focusing spot on the specimen plane. Variable axis collection lens 44 is located between the specimen plane 14 and the detector 19 for collecting the electron beam that has passed through the specimen plane 14.

Figure 4C:
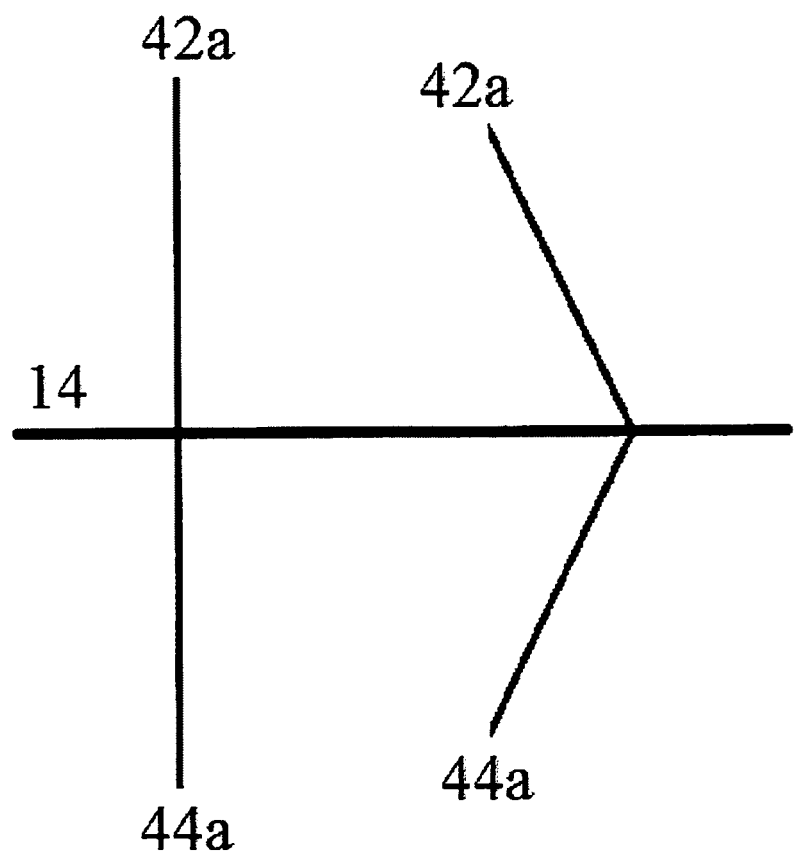
FIG. 4(c) schematically depicts that variable axis of objective lens and the variable axis of collection lens remain symmetrical about a specimen plane according to an embodiment of the present invention.

In preferred embodiments, the variable axis objective lens 42 and the variable axis collection lens 44 remain symmetrical about the specimen plane 14. As a result, variable axis 42a and variable axis 44a remain symmetrical about the specimen plane 14 as well, as shown in FIG. 4(c).

Referring back to FIG. 4(a), at the time when the focused beam 12 passes through the focusing spot, beam axis 12a may be in a direction substantially parallel to reference axis 13, or substantially perpendicular to the specimen plane 14. State in a different way, the tangent line of beam axis 12a at focusing point O2 is substantially parallel to reference axis 13, or is substantially perpendicular to specimen plane 14.

Figure 5C:
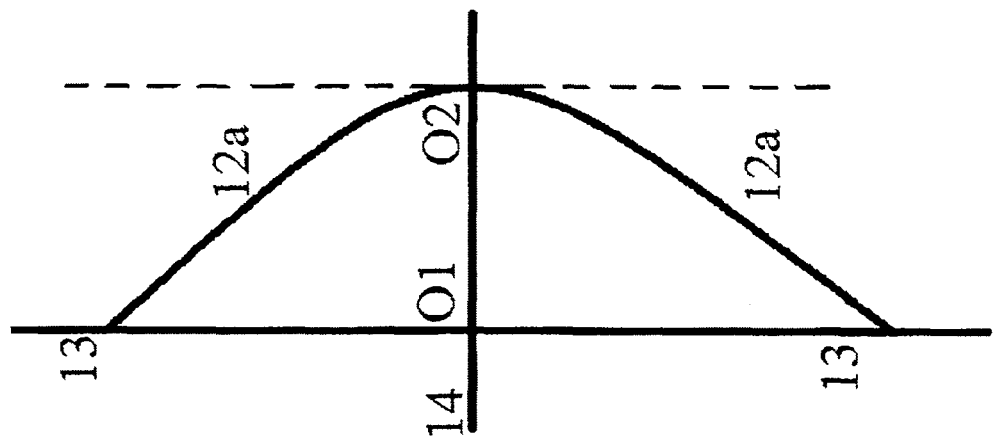
FIG. 5(c) illustrates still another electron beam path in which the tangent line of the beam at the focusing point is substantially perpendicular to the specimen plane according to an embodiment of the present invention.
Figure 5B:
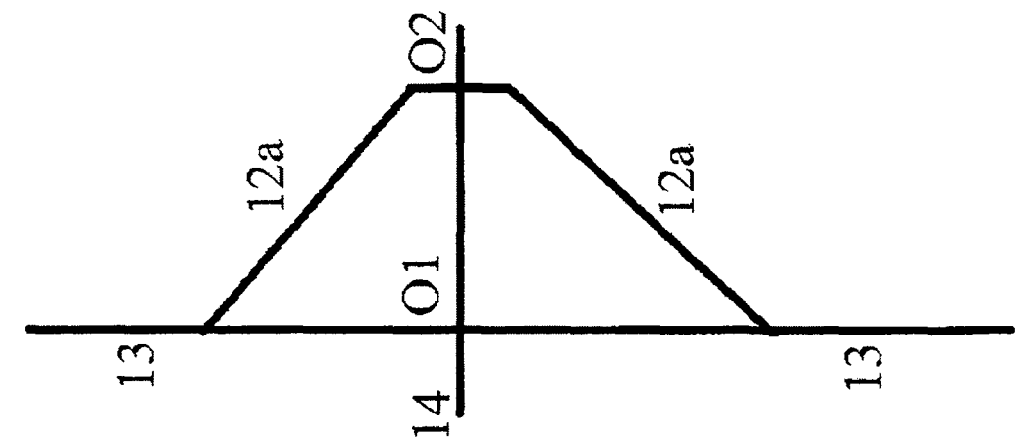
FIG. 5(b) illustrates another electron beam path in which the tangent line of the beam at the focusing point is substantially perpendicular to the specimen plane according to an embodiment of the present invention.
Figure 5A:
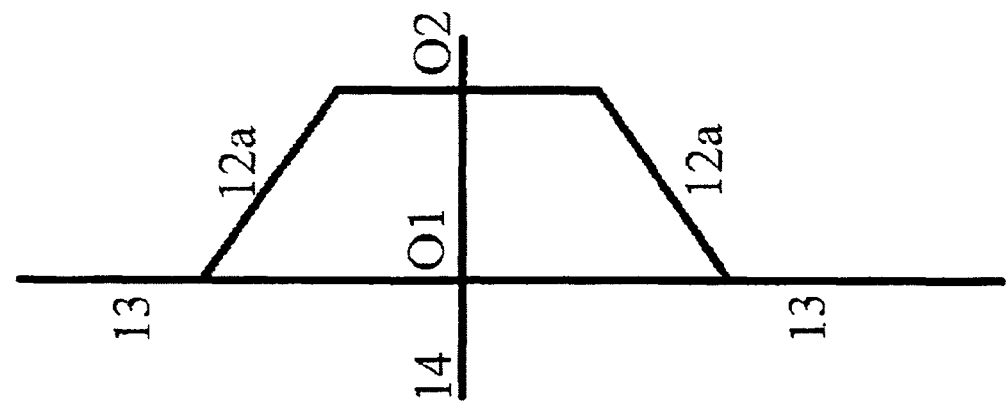
FIG. 5(a) illustrates an electron beam path in which the tangent line of the beam at the focusing point is substantially perpendicular to the specimen plane according to an embodiment of the present invention.

FIGS. 5(a) to 5(c) illustrate a few diagrams in which the tangent line of beam axis 12a at focusing point O2 is substantially parallel to reference axis 13, or is substantially perpendicular to specimen plane 14. With reference to FIG. 5(a), beam axis 12a becomes a line segment in the proximity of focusing point O2, and that line segment per se becomes the tangent line of beam axis 12a at O2, which is substantially parallel to reference axis 13, or is substantially perpendicular to specimen plane 14. FIG. 5(b) is similar to FIG. 5(a), except that the corresponding line segment in the proximity of focusing point O2 is much shorter in length as compared to FIG. 5(a). With reference to FIG. 5(c), beam axis 12a may be a curve in the proximity of focusing point O2, and the tangent line (represented as broken line) of beam axis 12a at focusing point O2 is substantially parallel to reference axis 13, or is substantially perpendicular to specimen plane 14. The term "substantially" herein should be understood as permitting less than 1° deviation or tilt from the line that is absolutely "parallel to reference axis 13" or absolutely "perpendicular to specimen plane 14".

Referring back to FIG. 4(a), second redirector 31 redirects electron beam 12 that has passed through both specimen plane 14 and variable axis collection lens 44 back to the path in alignment with reference axis 13, before beam 12 reaches, and is detected by, detector 19. Like first redirector 21, second redirector 31 may also include one or more magnetic deflectors, electrostatic deflectors, or any combination thereof. The output from detector 19 can be recorded as a function of (X,Y) scanning beam position on the sample, and an image can be constructed as a "map" of detector output as a function of (X,Y). The skilled artisan will be very familiar with these techniques, which require no further elucidation here.

One of the advantages associated with the STEM of the invention is that the transmission electron beam from different scanning position will have the same or similar radial emission angle when being projected on the detector 19. The term "axial" in the application means "in the optical axis direction of a round or multi-pole lens", while the term "radial" means "in a direction perpendicular to the optical axis". Redirector 31 can eliminate the positional effect on reception/detection of transmission electrons. The scanning field of primary beam 12 can be enlarged dramatically by adjusting first redirector 21 and variable axis objective lens 42 coordinately in raster-scanning process, and high image resolution can still be maintained. When redirector 21 redirects or deflects primary beam 12 at a large scanning field edge, off-axis aberrations will be significantly decreased because primary beam 12 can enter into the region near axis 44a of correction lens 44. In this invention, "off-axis" means "away from the optical axis of an apparatus" and "on-axial" means "on the optical axis of an apparatus". Moreover, redirector 31 can correct transmission electron from the position with large radial distance. For example, redirector 31 can correct the trajectory of transmission electrons from all the positions in the large scanning filed, including the edge and the central region of the field, back to reference axis 13.

For simplicity and clarity of illustration, other parts in the STEM are omitted in the figures. These parts may be, for example, electron optics, condenser lens, various control units, image aperture, correctors such as stigmators, image formation unit, and other optical components. A stigmator can compensate the beam shape of the primary electron beam that is incident onto the specimen plane 14. Other components in the STEM may include a retarding electrode below the variable axis objective lens and having an opening aligned with the optical axis for the primary electron beam passing through; and a specimen stage below the retarding electrode and supporting the specimen.

It should be appreciated that a specimen with certain thickness, as conceptualized and represented as specimen plane 14, is typically placed on a stage system (not shown) for adjusting the specimen height to the focused plane of electron beam 12, and for moving observed area of specimen. For example, the stage system may include a supporting stand for sustaining the weight of the system; a z-stage providing a degree of freedom in vertical direction respect to the ground; and an X-Y stage for a degree of freedom in the two horizontal direction respect to the ground.

In an example, the specimen is located between an upper pole piece and a lower pole piece of the magnetic lens field generator 41, as known to a skilled artisan in the field, to make an immersion objective lens system. An immersion objective lens ensures a small focused spot on specimen plane 14 because the spherical aberration coefficient and chromatic aberration coefficient are smaller than the objective lens field far away from the specimen plane.

Figure 6:
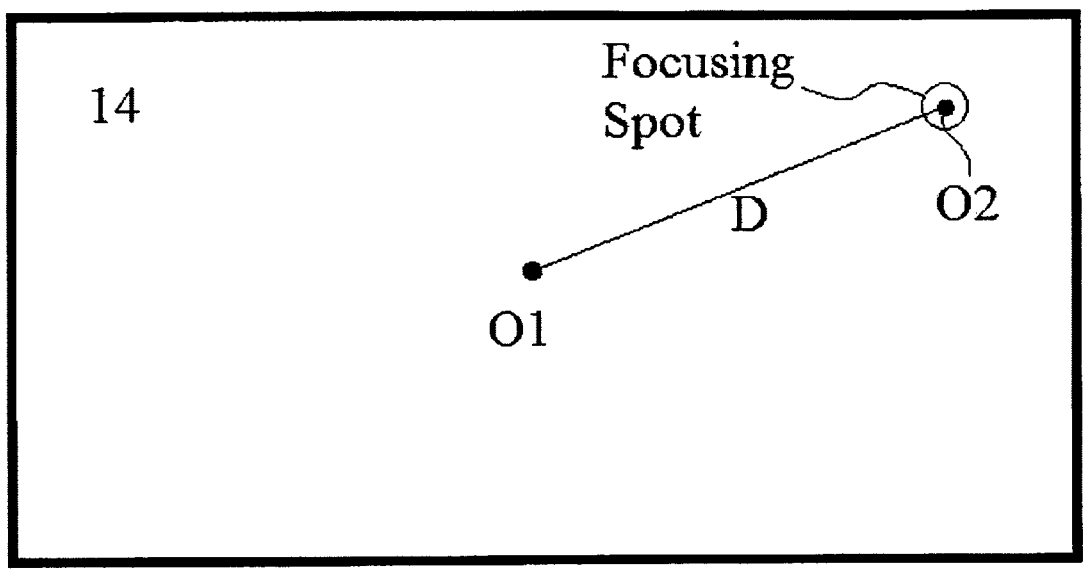
FIG. 6 shows that the focusing spot O2 of the electron beam can span across a large area on the specimen plane according to an embodiment of the present invention.

As previously mentioned, variable axis objective lens 42 focuses electron beam 12 that has been redirected by first redirector 21 to a focusing spot on specimen plane 14. The focusing spot may be a round dot with a dimension of e.g. 1 or 2 nm. However, the focusing spot may also take other shape such as oval. The central point of the focusing spot is conceptually defined as focusing point O2. As shown in FIG. 6, one advantage of the invention is that the distance D between reference point O1 and the center of the focusing spot (i.e. focusing point O2) can be varied from 0 to 600 um, from 0 to 300 um, from 0 to 100 um, or from 0 to 25 um (e.g. 0 to 20.28 um) with a focusing spot having a dimension (e.g. diameter) of no more than 5 nm, preferably no more than 2 nm, and more preferably no more than 1 nm.

The maximum scanning field of the STEM according to the invention can be 500 um×500 um, 250 um×250 um, or 100 um×100 um scanning field with a resolution small than 5 nm, or smaller than 2 nm. For example, the STEM of the invention may have a scanning field of 40 um×40 um with a 2-nm resolution in one setting; and a scanning field of 10 um×10 um with a 0.5-nm resolution in another setting.

In non-limiting examples, first redirector 21 generates a first deflective field, second redirector 31 generates a second deflective field, but none of said two fields has an overlap with the magnetic field of lens module 15. For example, first redirector 21 may include a pre-scan deflective system that works with the first in-lens deflector 43 for scanning the primary electron beam on the specimen plane 14. In other words, first redirector 21 and the first in-lens deflector 43 can be adjusted or tuned in a coordinated fashion to scan electron beam 12 across a target area on the specimen plane 14. The deflective field of the pre-scan deflective system has no overlap with variable axis objective lens 42, let alone variable axis collection lens 44. In embodiments of the invention, the pre-scan deflective system includes 1, 2, 3, 4 or more deflectors.

By the same token, an example of second redirector 31 may include an after de-scan deflective system that works with the second in-lens deflector 45 for correcting the transmission electron beam through the specimen back to the center axis of detector (part of reference axis 13). Similarly, the deflective field of after de-scan deflective system has no overlap with variable axis collection lens 44, let alone variable axis objective lens 42. In embodiments of the invention, the after de-scan deflective system includes 1, 2, 3, 4 or more deflectors.

In a specific embodiment, the pre-scan deflective system includes two deflectors for pre-deflecting the primary electron beam on an axis perpendicular to specimen plane 14 or parallel to (but not overlaps with) reference axis 13. These two deflectors can work with the first in-lens deflector 43 for laterally or parallel moving (like "sliding" on specimen plane 4) the central axis of the objective lens 42, as described above. The after de-scan deflective system may also have two deflectors for correcting the transmission electron beam back to the central axis of detector 19, which coincides with reference axis 13.

In another specific embodiment, the pre-scan deflective system includes only one deflector for pre-deflecting the primary electron beam along a swinging axis inclined to specimen plane 14. This single deflector can work with the first in-lens deflector 43 for swinging the central but variable axis 42a of objective lens 42 about a pivot above the specimen plane 14, as described above. The second in-lens deflector 45 has a coupling field with the collection lens 44 field below specimen pane 14 for swinging the central axis 44a of collection lens 44. The after de-scan deflective system includes only one deflector for correcting the transmission electron beam along an axis inclined to specimen back to the central axis of detector 19 (or reference axis 13).

In non-limiting examples, detector 19 may have (A) a disk-shaped bright-field detective area in the center to catch only electrons that have directly irradiated onto, and transmitted through, the specimen; and (B) a ring-shaped dark-field detective area outside the disk to catch electrons that have scattered-in and transmitted through the specimen. In some embodiments, the bright-field detective area and dark-field detective area are located on different height to enhance receiving efficiency.

When the primary beam 12 is focused on a specimen in an immersion field, electrons that transmit the thin film specimen is focused and projected on detector 19. The transmission electrons carry the information about the structure and materials of the specimen. The detector is usually divided into bright-field detective portion and dark-field detective portion to catch the transmission electron with different angular ranges. The bright-field detector collects the direct transmission electrons and the dark-field detector mainly collects the scatter transmission electrons taking atomic number signal in large angular range. In the STEM of the invention, the transmission electrons from the entire scanning field can be projected on detector 19 circle-symmetrically as transmission electrons from point O1. The bright-field and dark-field detectors can therefore catch the signal transmission electrons precisely corresponding to transmission angle, so the image quality and contrast at the edge of the scanning field is as good as that of the scanning center O1. A high resolution image in large scanning field can therefore be obtained.

As an advantage of the invention, the transmission electron beam 12 according to the radial angle as detected by detector 19 is independent of (not affected by) the location of the focusing spot or focusing point O2 on specimen plane 14. In other words, the detector for receiving the transmission electron beam according to the radial angle has nothing to do with the scanning position on the specimen plane.

Figure 7:
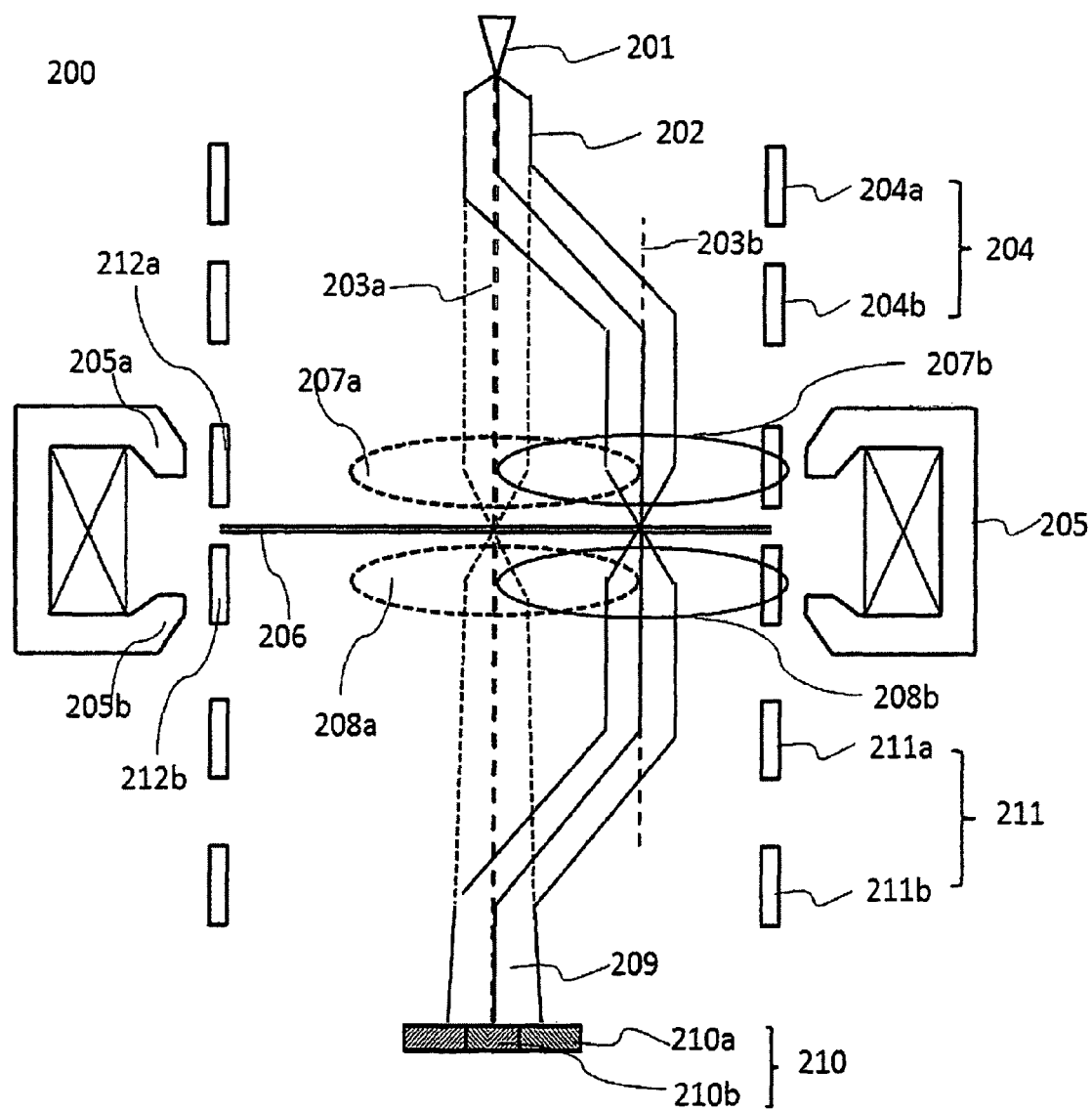
FIG. 7 schematically shows a STEM in which both the variable axis objective lens and the variable axis collection lens are laterally movable on the specimen plane according to an embodiment of the present invention.

In a group of embodiments featured by a moving (or "sliding") objective lens as described above, the first redirector 21 may include two or more deflectors for redirecting electron beam 12 to a path perpendicular to the specimen plane 14. The first in-lens deflector 43 has a coupling field with the magnetic field of the objective lens 42 for moving (or "sliding on plane 14") the central axis 42a of the magnetic objective lens so that 42a is in alignment with the redirected electron beam axis 12a. Second redirector 31 may also include two or more deflectors that redirect the electron beam 12 to a path in alignment with the reference axis 13 before the beam 12 reaches the detector 19. FIG. 7 schematically shows such a STEM. With reference to FIG. 7, STEM 200 using variable axis objective/collection lens can achieve relative large scanning field. Primary beam 202 (an example of beam 12 in FIG. 4(*a*)) is emitted from electron source 201 (an example of electro source 11) with an energy such as 1~80 keV. Beam 202 then lands on specimen 206, which can be conceptualized as an example of specimen plane 14. Specimen 206 is placed between upper pole piece 205a and lower pole piece 205b of magnetic lens field generator 205 (AKA magnetic lens 205, an example of magnetic lens field generator 41) to make an immersion lens field so as to gain a small focused spot size.

First redirector 21 in this example includes a pre-scan deflective system 204 as shown in FIG. 7. System 204 comprises deflectors 204a and 204b placed between electron source 201 and lens 205. Both deflective fields of deflectors 204a and 204b are away from variable axis objective lens 207a/b and do not overlap the field thereof. The variable axis objective lens above specimen 16 is shown as a convex lens field 207a/207b; and the variable axis collection lens below specimen 16 is shown as a convex lens field 208a/208b.

Lens module 15 in this example may comprise magnetic lens 205, first in-lens deflector 212a, and second in-lens deflector 212b.

With reference to FIG. 7, first in-lens deflector 212a is close to specimen 206 and its deflective field may overlap with variable axis objective lens 207a. Most importantly, the deflective field is designed to couple with variable axis objective lens 207a. Primary beam 202 is first deflected by a pre-scan deflective system including deflectors 204a and 204b, and transmitted along a new axis 203b which is substantially parallel to central optical axis 203a (an example of reference axis 13) and substantially perpendicular to specimen 206. The first in-lens deflector 212a generates an appropriate coupling deflective field in objective lens 207a, to effectuate the parallel moving (or sliding) the axis of objective lens 207a on the specimen plane away from the center optical axis 203a to a new axial position 203b, making 207a a "variable axis" objective lens. Thus it seems that a new lens 207b is formed away from center optical axis with a large radial distance. In preferred embodiment, pre-deflected primary beam 202b precisely enters into the center focused axis of objective lens 207b and is focused to a small spot on specimen 206. The off-axis aberrations are significantly reduced and the focused spot size is close to that in scanning center (point O1). So the scanning field is significantly expanded, while high resolution is still maintained across the entire scanning field.

Under a working principle similar to the variable axis objective lens above specimen 206, the variable axis collection lens below specimen 206 is used to collect, and correct the trajectory of, transmission electron beam 209 from large scanning field edge. With reference to FIG. 7, second in-lens deflector 212b is close to specimen 206; and its deflective field may overlap with variable axis collection lens 208a. The deflective field is designed for coupling with the field of collection lens 208a. Second in-lens deflector 212b has an appropriate deflective field to effectuate the parallel moving (or sliding) the axis of collection lens 208a on the specimen plane away from the center optical axis 203a to a new axial position 203b, making 208a a "variable axis" collection lens. As such, a new focused lens 208b is formed at axis 203b with large radial distance. Transmission electron beam from off-axis position is first condensed by movable axis lens field 208b along axis 203b and then deflated back to center optical axis 203a by a redirector 31. Redirector 31 is this example comprises an after-de-scan deflective system 211 which includes two deflector 211a and 211b. Variable axis collection lens 208a/208b works with after de-scans deflective system 211 and detector 210 (an example of detector 19) to eliminate the effect of positional difference of transmission beams. All transmission electron beams from large scanning field can be captured or received by detector 210 giving the same result. A circle-shaped detector 210 has a circle bright-field detective area 210a in center and a ring dark-field detective area 210b outside. Transmission signal electrons can be captured by bright-field detective area 210a and dark-field area 210b respectively according to radial angle, even in large scanning field edge. Scatter transmission electrons with large radial angle are received by dark-field detective area only. Bright-field detective area catches the direct transmission electrons only. The image contrast is good even in large scanning field edge. So the image resolution in the scanning center and the image resolution at the edge demonstrate similar or same quality. By reducing or eliminating large off-axis aberrations in large scanning field and by correcting transmission electron beam trajectory from large scanning field with the above variable axis lens module, STEM in this embodiment achieves a high resolution image and large scanning field simultaneously. The scanning field size can be, for example, 40 um×40 um with 2 nm resolution and 10 um×10 um with 0.5 nm resolution.

Figure 8:
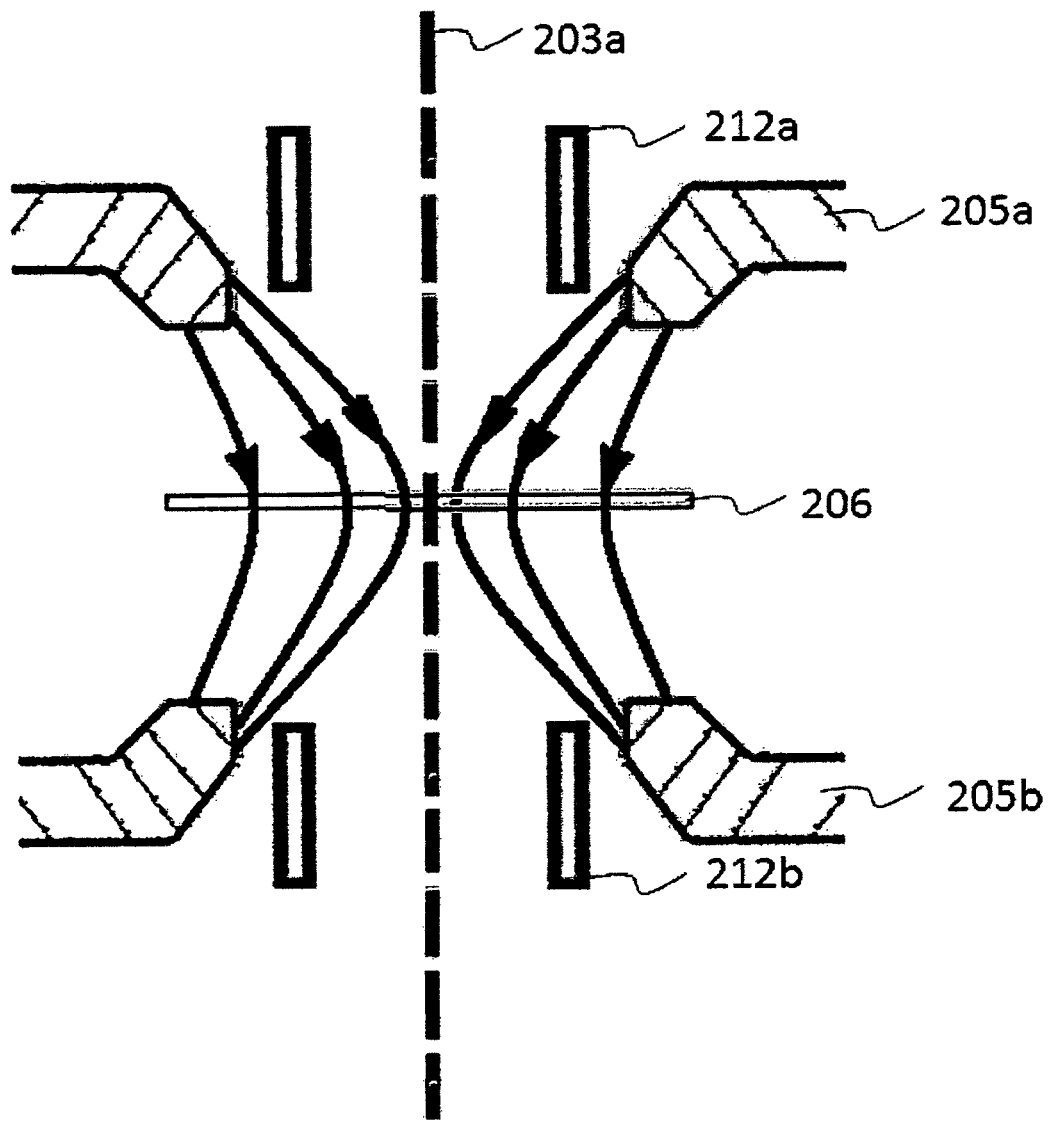
FIG. 8 schematically shows an exemplary lens module according to an embodiment of the present invention.

FIG. 8 schematically shows an exemplary lens module 15 in the STEM 200 as shown in FIG. 7. A magnetic lens 205 has upper pole piece 205a and lower pole piece 205b, both of which are made by soft magnetic materials. An intense magnetic field in lens module 15 is formed, and specimen 206 is immersed in this field. First/second in-lens deflector 212a/212b generates deflective field that overlaps with the field of magnetic lens 205. Deflectors 212a and 212b can be electrostatic or magnetic deflectors. Preferably, 212a and 212b are selected from electrostatic deflectors. An electrostatic deflector has fast scanning speed compared to a magnetic deflector, because a magnetic deflector suffers from hysteresis effect with pole piece, and slows down the scanning speed.

Figure 9:
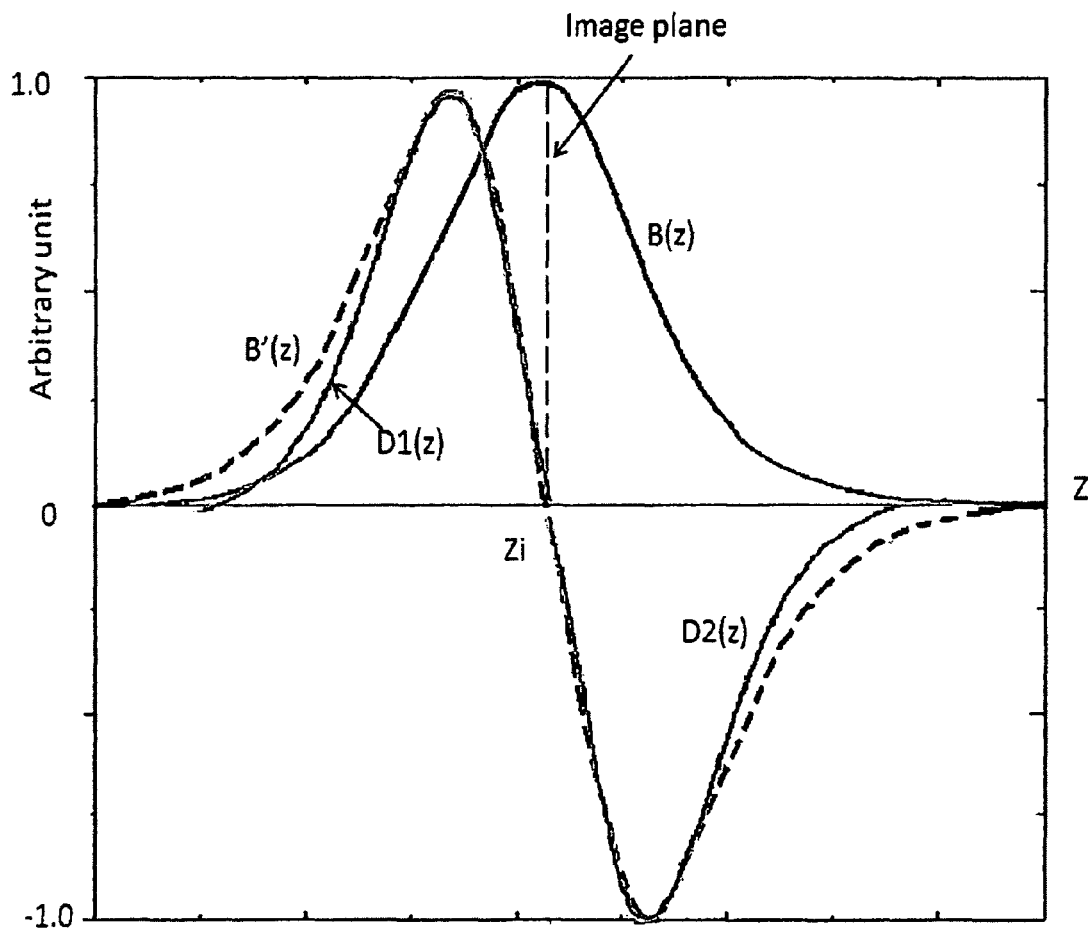
FIG. 9 demonstrates the coupling relationship between an objective lens field and the deflective field of two deflectors according to an embodiment of the present invention.

If central optical axis 203a (reference axis 13) is defined as Z axis and the direction from electron source to specimen/detector is defined as the positive direction, FIG. 9 can show the coupling relationship between magnetic lens 205 field and deflective field of deflectors 212a and 212b. In FIG. 9, $B(z)$ is the magnetic axial flux density distribution of lens 205 along Z axis. Specimen 206 is on the image plane Zi (an example of specimen plane 14 in FIG. 4(a)), which is on or near the maximum field intensity position. $B'(z)$ is the derivative of $B(z)$. Deflector field of 212a and 212b is designed to satisfy the coupling condition with the magnetic lens field: $D(z)=\frac{1}{2} rB'(z)$.

$D(z)$ is the in-lens deflective field of 212a and 212b, and r, as an example of D between O1 and O2 as described above, is the distance from variable axis 203b to the center optical axis 203a. When the field distribution of 212a and 212b is close to the distribution of $B'(z)$ along Z axis, it is easier to provide the coupling condition, and the parallel moving of the axis of objective/collection lens along Zi can eliminate the off-axis aberrations. Referring to FIG. 9, $D1(z)$ is the deflective field distribution of deflector 212a which has a similar field distribution as $B'(z)$ above specimen to move the center axis of objective lens field. $D2(z)$ is the deflective field distribution of deflector 212b which has a similar field distribution as $B'(z)$ below specimen to move the center axis of collection lens field.

In another group of embodiments featured by a "swing" objective lens, the first redirector 21 comprises a single deflector for redirecting the electron beam to a path not "substantially perpendicular" (or inclined) to specimen plane 14. The first in-lens deflector has a coupling field with the magnetic objective lens field located above the specimen plane for swinging the central axis thereof, so that said central axis is substantially in alignment with the redirected electron beam. The second in-lens deflector has a coupling field with the magnetic collection lens field located below the specimen plane for swinging the central axis thereof, so that said central axis is substantially in alignment with the electron beam when the beam exits from the collection lens. The second redirector 31 comprises a single deflector that redirects the electron beam to a path in alignment with the reference axis before the beam reaches the detector.

Figure 10:
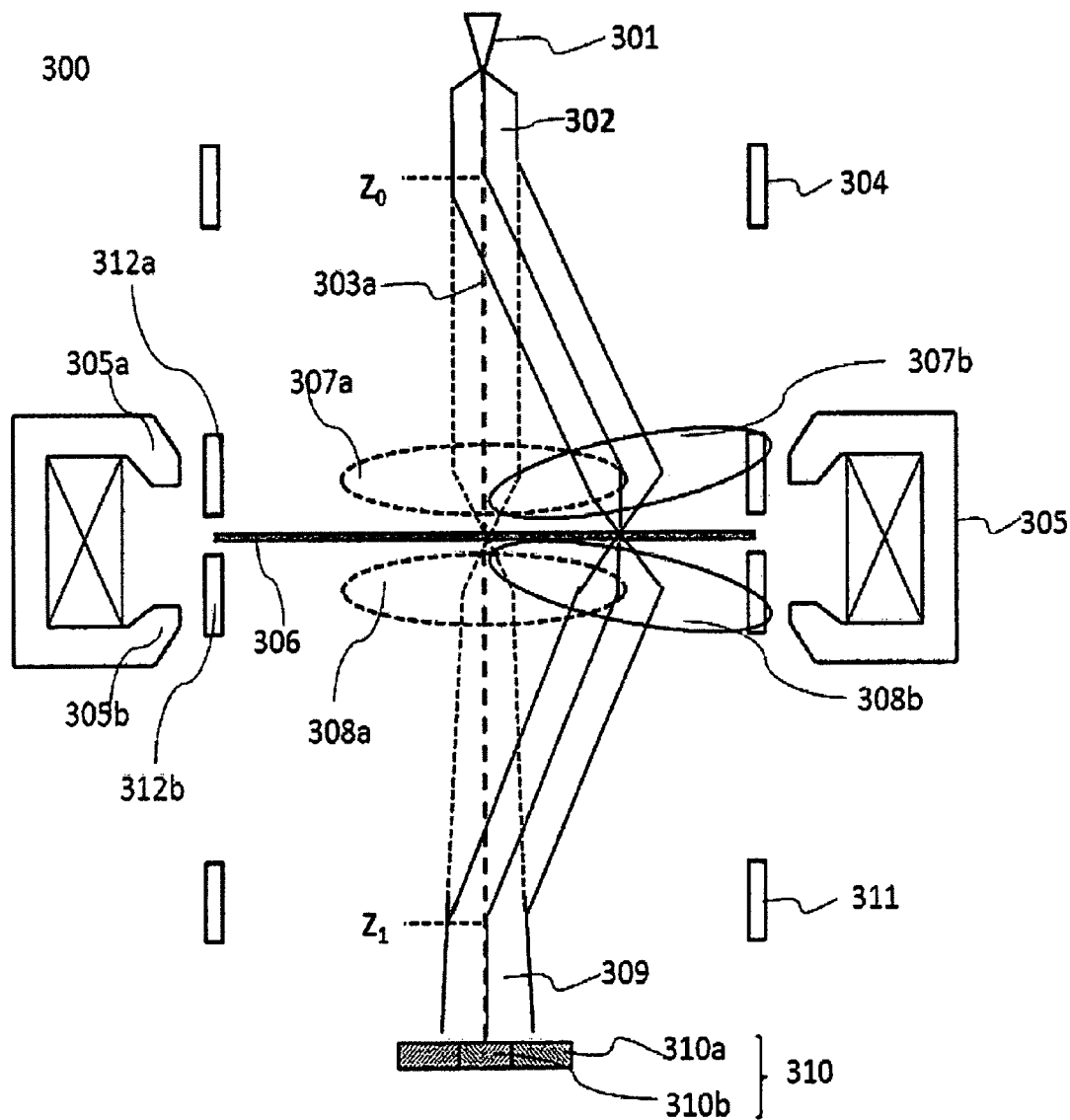
FIG. 10 schematically shows a STEM in which the variable axis objective lens and the variable axis collection lens can swing above and below the specimen plane respectively, according to an embodiment of the present invention.

FIG. 10 schematically shows a scanning transmission electron microscope within the group of embodiments featured by a "swing" objective lens. In STEM 300 as shown in FIG. 10, the variable axis of the objective lens is "varied" by swinging above the specimen. For large scanning field, primary beam 302 emitted from electron source 301 is first deflected with a small tilted angle by first redirector 21 such as pre-scan deflector 304 at position Z0 on center optical axis 303a (an example of reference axis 13). Position Z0 can be viewed as the pivot of the "swing".

In lens module 15 of STEM 300, first in-lens deflector 312a has a designed coupling field with objective lens 307a. An appropriate deflective field is generated to swing the axis of 307a to a new position 307b about "pivot" point Z0. Thus the primary beam 302 enters into the center of objective lens 307b along the new axis of focused lens with small off-axis aberrations. STEM 300 can therefore earn the ability to scan over a large scanning field with high resolution image. Similar to variable axis objective lens 307a/b above specimen 306, second in-lens deflector 312b couples with collection lens 308a field to swing the lens to a new position 308b to collect and condense transmission beam 309. The new focusing field axis in 308b is swung with a small angle about "pivot" position Z1. An after de-scan deflector 311 (an example of second redirector 31) at the position Z1 corrects the trajectory of transmission electron beam from large scanning field edge back to the center optical axis 303a, as if the transmission electron beam comes from the scanning center O1. And then detector 310 (an example of detector 19) captures the transmission electron beams according to radial angle in all scanning field. As a result, a good image quality is achieved in large scanning field. In STEM 300, lens with swingable axis for large scanning field may have a little bit more off-axis aberrations as compared to lens with movable or slide-able axis, but the scanning field is still much larger than conventional STEM 100a and 100b, and the image resolution remains good. A significant advantage of STEM 300 is that the deflector system is simpler than that in STEM 200. The deflectors in STEM 300 could be magnetic or electrostatic type. For deflector 312a and 312b, electrostatic type is preferred because the two deflectors are immersed in lens module field, and electrostatic deflector is not implicated with hysteresis effect that slows down the scanning speed.

The coupling condition between the deflective field of deflectors 312a and 312b with lens module field in STEM 300 is $D(Z)=0.5 rB'(z)+r'B(z)$. The variable $0.5 rB'(z)$ is the component of lateral moving the lens axis parallel to center optical axis 303a. The variable r'B(z) is the component of tilting the lens axis. When the coupling condition is achieved, it is easier to achieve a large scanning field with small off-axis aberrations. The specimen is put on or near the plane having maximum field intensity, and small focused spot size can therefore be ensured.

In summary, the present invention can provide a large scanning field with high resolution image in STEM. A detailed image in large area on specimen can be obtained at one time. In other words, the scanning process can be completed using a single and continuous scanning operation. As a merit, the throughput of STEM can be significantly improved.

The invention provides a scanning transmission electron microscope (STEM) having both large scanning field and high image resolution. The sample is typically put into an immersion focal field. A variable axis objective lens (VAL) including a convergent field and a deflector above the sample can focus and scan a primary electron beam on the sample, to obtain a large scanning field with low off-axis aberrations. Another variable axis lens (VAL) including a focused field and a deflector below the sample can converge and correct the transmission electrons back to central axis of the STEM, to ensure the quality of transmission image. The invention improves the throughput of STEM at high resolution by utilizing large scanning ability of a variable axis objective lens combined with a variable axis collection lens.

As briefly mentioned above, the present invention can, on one hand, enlarge the STEM scanning field, while on the other, maintain high image resolution. In an exemplary embodiment, the lens module 15 of the invention may include a variable axis objective lens for primary scanning beam and a variable axis collection lens (or projection lens) for transmission signal beam. It should be appreciated that other configurations of lens module 15 are also possible. The variable axis objective lens may include an immersion objective lens and a coupled deflector. Thin film specimen is put between upper pole piece and lower pole piece of a magnetic lens, at or near the maximum field plane, to ensure small spot size of focused primary beam so as to achieve high image resolution. A specially designed deflector has a coupled field with the objective lens is able to shift the center optical axis of the objective lens. When the primary electron beam is deflected by the pre-scanning deflector(s) to off-axis position, the coupled deflector shift the axis of objective lens to eliminate the off-axis chromatic aberrations and/or coma aberrations, or reduce them to a near zero level. So the primary beam can scan over a much larger field in the STEM of the invention without degraded image resolution caused by off-axis aberrations at scanning field edge.

Furthermore, a de-scan variable axis detective system is provided in this invention. This equipment ensures electron beam which has been scanned away from center axis in large field can be detected appropriately after passing through specimen as the center electron beam. A deflector coupled with the focus field of the collection lens below the specimen has the ability to shift the center optical axis of the collection lens, in a manner similar to variable axis objective lens, to eliminate off-axis aberrations of the signal electrons passed though specimen. The transmission electron beam is focused by the variable axis collection lens below the specimen, then de-scanned back to center axis, and at last detected by a transmission electron detector. The detector is composed of a bright-field detective area and a dark-field detective area. The transmission electron beam from the central area of the scanning field, and the beam from the edge or peripheral area, are detected according to transmission angle with the same effect by bright-field and dark-field areas. Such same effect provides similar image resolution and similar contrast ratio all over the large scanning field. In contrast, conventional STEMs cannot provide an image resolution and contrast in the scanning edge, same as or similar to those in the scanning center, because the influence of different transmit position in the scanning field is not compensated.

In accordance with the inventions, relative larger scanning field and high resolution image are obtained in STEM without the negative influences caused by off-axis aberrations and scanning positions. STEM of the invention can scan a much larger field of specimen in each time and can accomplish a higher throughput, as compared to conventional STEMs.

Various embodiments of the present invention are described above in detail. However, those skilled in the art should understand that various modifications, combinations or sub-combinations may be made to these embodiments without departing from the principles and spirits of the present invention and such modifications should fall within the scope of the present invention.

The invention claimed is:

1. A scanning transmission electron microscope (STEM) comprising:
   an electron source for emitting a primary electron beam;
   a detector for receiving the electron beam, wherein a reference axis is defined by the straight line connecting the electron source and the detector;
   a specimen plane located between the electron source and the detector, wherein the reference axis is perpendicular to the specimen plane;
   a first redirector that redirects the electron beam to a path not in alignment with the reference axis;
   a magnetic lens for making an immersion lens field comprising two in-lens deflectors including a first in-lens deflector and a second in-lens deflector, a variable axis objective lens having a central axis, and a variable axis collection lens having a central axis, between the objective lens and the collection lens being the specimen plane, wherein the variable axis objective lens is located between the electron source and the specimen plane for focusing the electron beam redirected by said first redirector to a focusing spot on the specimen plane, wherein the variable axis collection lens is located between the specimen plane and the detector for collecting the electron beam that has passed through the specimen plane, wherein the variable axis objective lens and the variable axis collection lens are symmetrical about the specimen plane, wherein the central axis of the variable axis objective lens is varied by the first in-lens deflector; and wherein the central axis of the variable axis collection lens is varied by the second in-lens deflector; and
   a second redirector that redirects the electron beam that has been collected by the variable axis collection lens back to a path in alignment with the reference axis, before the beam reaches the detector.

2. The STEM according to claim 1, wherein the focused beam passes through the focusing spot in a direction substantially parallel to the reference axis, or substantially perpendicular to the specimen plane.

3. The STEM according to claim 1, wherein the first redirector has a first deflective field that has no overlap with the field of the variable axis objective lens, and the second redirector has a second deflective field that has no overlap with the field of the variable axis collection lens.

4. The STEM according to claim 3, wherein the first redirector and the first in-lens deflector are adjustable in a coordinated manner to scan the electron beam across a scanning field on the specimen plane; and wherein the second redirector and the second in-lens deflector are adjustable in a coordinated manner to receive the electrons that have passed through the specimen plane.

5. The STEM according to claim 4, wherein the first redirector comprises two deflectors for redirecting the electron beam to a path substantially perpendicular to the specimen plane.

6. The STEM according to claim 5, wherein the first in-lens deflector moves the central axis of the variable axis objective lens through a coupling field to an effect that said central axis is in alignment with the redirected electron beam.

7. The STEM according to claim 6, wherein the second in-lens deflector moves the central axis of the variable axis collection lens through a coupling field to an effect that said central axis is in alignment with the electron beam that has passed through the specimen plane.

8. The STEM according to claim 7, wherein the second redirector comprises two deflectors that redirect the electron beam back to a path in alignment with the reference axis before the beam reaches the detector.

9. The STEM according to claim 4, wherein the first redirector comprises one deflector for redirecting the electron beam to a path not substantially perpendicular to the specimen plane.

10. The STEM according to claim 9, wherein the first in-lens deflector swings the central axis of the variable axis objective lens through a coupling field to an effect that said central axis is in alignment with the redirected electron beam.

11. The STEM according to claim 10, wherein the second redirector comprises one deflector that redirects the electron beam back to a path in alignment with the reference axis before the beam reaches the detector.

12. The STEM according to claim 4, wherein the magnetic lens generates a stationary magnetic focusing field, and the specimen plane is located on or near the plane with maximum field intensity in the magnetic focusing field.

13. The STEM according to claim 4, wherein the detector has a disk-shaped bright-field detective area in the center, and a ring-shaped dark-field detective area outside the disk.

14. The STEM according to claim 4, wherein the transmission electron beam according to the radial angle as detected by the detector is independent of the location of the focusing spot.

15. The STEM according to claim 1, wherein said reference axis passes through a reference point on the specimen plane, and wherein the distance between said reference point and the center of said focusing spot can be varied from 0 to 500 um with a focusing spot having a dimension of no more than 2 nm.

16. The STEM according to claim 4, which has a scanning field of 40 um×40 um with a 2-nm resolution.

17. The STEM according to claim 4, which has a scanning field of 10 um×10 um with a 0.5-nm resolution.

* * * * *